United States Patent
Yamada et al.

(10) Patent No.: US 6,777,954 B2
(45) Date of Patent: Aug. 17, 2004

(54) FAULTY WIRING DETECTION DEVICE FOR AIR CONDITIONER

(75) Inventors: Hiroyasu Yamada, Tokyo (JP); Shigenobu Mochizuki, Tokyo (JP); Kazuyuki Katayama, Tokyo (JP); Kazuhiro Kazama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 111 days.

(21) Appl. No.: 10/179,987

(22) Filed: Jun. 26, 2002

(65) Prior Publication Data

US 2003/0169052 A1 Sep. 11, 2003

(30) Foreign Application Priority Data

Mar. 8, 2002 (JP) .......................................... 2002-064166

(51) Int. Cl.[7] .............................................. G01R 31/00
(52) U.S. Cl. ......................... 324/543; 324/508; 324/510
(58) Field of Search ................................. 324/508, 509, 324/510, 511, 543

(56) References Cited

U.S. PATENT DOCUMENTS

| 3,810,003 | A | * | 5/1974 | Portoulas ..................... 324/508 |
| 4,016,489 | A | | 4/1977 | Adams et al. |
| 4,164,701 | A | | 8/1979 | Gulledge et al. |
| 5,062,278 | A | * | 11/1991 | Sugiyama ..................... 62/230 |
| 5,525,908 | A | * | 6/1996 | Brownell ..................... 324/508 |
| 6,614,217 | B2 | * | 9/2003 | Oohashi ..................... 324/107 |

FOREIGN PATENT DOCUMENTS

| DE | 1600 16 | 4/1983 |
| FR | 2 421 390 | 3/1978 |
| JP | 63-190389 | 8/1988 |
| JP | 64-23051 | 1/1989 |
| JP | 2-241367 | 9/1990 |
| JP | 8-184627 | 7/1996 |
| JP | 10-010181 | 1/1998 |
| JP | 10-332761 | 12/1998 |
| WO | WO 96/39634 | 12/1996 |

* cited by examiner

Primary Examiner—N. Le
Assistant Examiner—Timothy J. Dole
(74) Attorney, Agent, or Firm—Oblon, Spivak, McClelland, Maier & Neustadt, P.C.

(57) ABSTRACT

An air conditioner includes an air conditioning unit, and three wiring lines for supplying power to the air conditioning unit. The three wiring lines are a pair of single phase AC power lines and an earth line which are to be connected to three source lines. The three source lines are a pair of single phase AC source lines and a ground line. The air conditioner also includes a detection unit including a detecting device that detects voltages between each of the AC power lines and the earth line, a conversion device that converts the voltages detected by the detecting device into logic level signals, a comparator that determines presence or absence of faulty connection between the three wiring lines and the three source lines by comparing the logic level signals obtained by the conversion device with reference logic level signals, and an output device that shows a result of determination made by the comparator.

7 Claims, 13 Drawing Sheets

FAULTY WIRING DETECTION DEVICE FOR AIR CONDITIONER

BACKGROUND OF THE INVENTION

1. Field of the Invention

This invention relates to a faulty wiring detection device for an air conditioner, which improves the safety of an air conditioner by preventing faulty wiring to a power supply to be connected with the air conditioner.

2. Description of the Related Art

FIG. 11 is a diagram illustrating normal wiring between a conventional air conditioner and a power supply, where denoted 1 is a primary power supply that provides a single-phase alternating current, 2 a ground resistance existing between an N-phase of the primary power supply and a ground, 3 a ground point, 4 wiring from the primary power supply, 5 a wall socket for the air conditioner, 6 a plug of the air conditioner, 7 a power cord of the air conditioner, 8 an indoor unit of the air conditioner, 9 a power supply terminal block of the indoor unit 8, 10 a control board of the indoor unit 8, 11 power supply wiring from the indoor unit 8 to an outdoor unit 12 of the air conditioner, 12 the outdoor unit of the air conditioner, 13 a power supply terminal block of the outdoor unit 12, and 14 a control board of the outdoor unit 12.

FIG. 12 is an example of a wiring diagram showing faulty wiring of the power supply in a conventional air conditioner. Similar components shown in FIG. 12 have the same symbols as in FIG. 11, and their descriptions are not repeated. Denoted 15 is an insulation resistance between the ground point 3 and a ground terminal E of the power supply terminal block 13 of the outdoor unit 12.

Referring now to FIG. 12, the operation of the air conditioner is described for the case in which it has faulty wiring in the power lines.

As a first example of faulty wiring, if the L-phase of the primary power supply 1 is improperly coupled with the ground terminal E of the wall socket 5 for the air conditioner, then the source voltage is directly applied to the ground terminals E of the indoor unit 8 and the outdoor unit 12. The housing of the outdoor unit 12 and the piping are connected to the terminals E of the power supply terminal block 9 of the indoor unit 8 and the power supply terminal block 13 of the outdoor unit 12. Thus, current i=V/R(A) runs that is determined by an insulation resistance R between the terminal E and the ground point 3 (where V is the source voltage of the primary power supply 1). In this case, unless a ground-fault circuit interrupter or an automatic overcurrent breaker is installed between the primary power supply 1 and the wall socket 5 for the air conditioner, a current larger than the tolerance runs in the power cord 7 of the air conditioner and causes heat generation in the cord, leading to a dangerous condition, if this insulation resistance R falls for any reason. Al this moment, the air conditioner is not activated because there is no sufficient voltage applied for operation between the L-phase and N-phase on the power supply terminal blocks 9 and 13 of the air conditioner.

FIG. 13 shows a second example of a wiring diagram showing faulty wiring of the power supply in the conventional air conditioner. Since the N-phase of the primary power supply 1 is coupled with the ground terminal E of the wall socket 5 for the air conditioner, the voltage applied between the N-phase and the terminal E is also applied to the metallic portions of the air conditioner such as the housings of the indoor unit 8 and the outdoor unit 12 and the piping. At this moment, a current i, which is determined by the sum of resistances (r+R) Ω (ohm), namely, the ground resistance r of the N-phase of the primary power supply 1 and the ground resistance R of the outdoor unit 12, runs in the ground line E. If an automatic overcurrent breaker for cutting wiring executed by an excessive current larger than a rated current for wiring is installed between the-primary power supply 1 and the wall socket 5 for the air conditioner, this flow of current i may cause a dangerous situation.

The air conditioner may operate normally because current runs in the indoor unit 8 and the outdoor unit 12, as shown in FIG. 13, from the L-phase to the ground line E of the primary power supply 1 via the N-phase of the wall socket 5, the N-phase of the power supply terminal block 9 of the indoor unit 8, the N-phase of the power supply terminal block 13 of the outdoor unit 12, the control board 14 of the outdoor unit 12, the L-phase of the power supply terminal block 13 of the outdoor block 12, the L-phase of the power supply terminal block 9 of the indoor unit 8, and the L-phase of the wall socket 5, and the voltage of the primary power supply is applied to the control boards 10, 14 of the indoor unit 8 and the outdoor unit 12. The air conditioner thus appears to work properly despite the faulty wiring if the ground resistance R is large. However, if the ground resistance becomes small for any reason, a large current beyond the tolerance runs in the ground line E and may cause heat generation in the wiring.

In the conventional air conditioners of the above configuration, it is necessary to check for the presence/absence of faulty wiring in the indoor power lines during installation. However, this check is not always performed during the installation of an air conditioner. Moreover, at this moment, even if an automatic overcurrent breaker is installed at a proper position to protect wiring and appliances from overheating caused by overcurrent and short circuit, there may be such problems as overheating due to overcurrent caused by the faulty wiring, unless a proper shut-off current is set in the automatic overcurrent breaker against the rated current for the wiring.

SUMMARY OF THE INVENTION

This invention has been made to solve those problems, and an object thereof is to provide such a faulty wiring detection device for an air conditioner that has a simple structure and does not affect the operation of the air conditioner itself. Also this device can detect faulty wiring to the source line of the primary power supply, if any, during installation of an air conditioner, and can notice the user of the presence/absence of faulty wiring through visual, alarm and other means. In addition, this device can prevent problems such as overheating of the circuit due to faulty wiring by shutting off the power lines of the air conditioner.

The faulty wiring detection device according to the present invention is a device for detecting faulty wiring of an air conditioner which is powered by a single-phase two-wire system, a single-phase three-wire system, or a single-phase lower voltage of a three-phase four-wire system, the device comprising: electric signal detection means for detecting an electric signal in between a ground line, a neutral line of the power supply system or one of power lines (hereafter, referred to as "N-phase") of a 200V single-phase three-wire system and a ground line (hereafter, referred to as "E"), and between a power line or the other power line (hereafter, referred to as "L-phase") with respect to the N-phase power line of the 200V single-phase three-wire system and E;

determination means for determining the presence/absence of faulty wiring in the power lines connected to the aforementioned power supply terminal block based on the electric signal provided by the electric signal detection means; and output means for driving a display or alarm means that shows a determination result provided by the determination means.

The electric signal detection means comprises photo-couplers each connected between the L-phase and E and between the N-phase and E.

The electric signal detection means comprises resistors each connected between the L-phase and E and between the N-phase and E.

The electric signal detection means comprises capacitors each connected between the L-phase and E and between the N-phase and E.

Further, there is provided shut-off means for shutting off the electric signal detection means from the N-phase and L-phase based on a signal provided by the output means when the determination means has detected faulty wiring.

There is also provided shut-off means for shutting off the power lines connected to the air conditioner based on a signal provided by the output means when the determination means has detected faulty wiring.

There is also provided shut-off means for shutting off the power lines of a peripheral external device of-the air conditioner based on a signal provided by said output means when the determination means has detected faulty wiring.

DERAILED DESCRIPTION OF THE PREFERRED EMBODIMENTS

Embodiment 1

Figure 1:
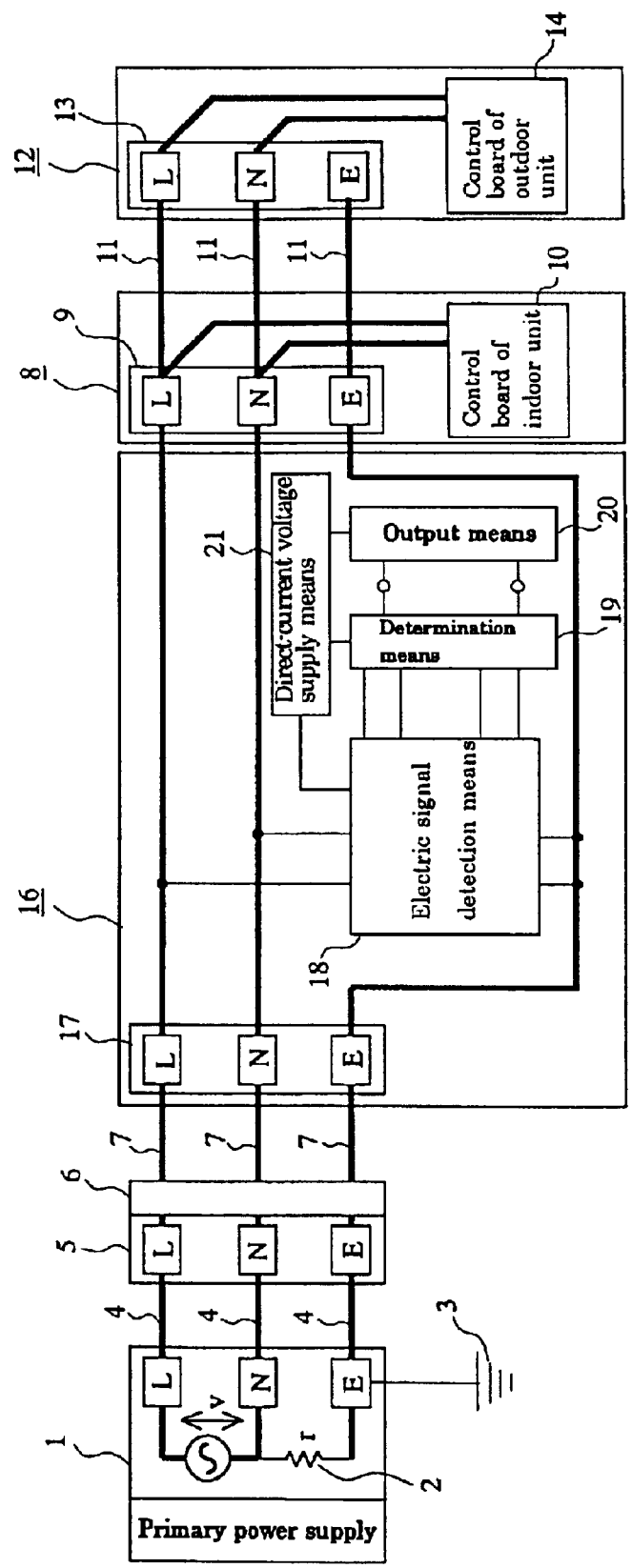
FIG. 1 is a power supply wiring diagram including a faulty wiring detection device for an air conditioner in accordance with a first embodiment of the present invention.
Figure 2:
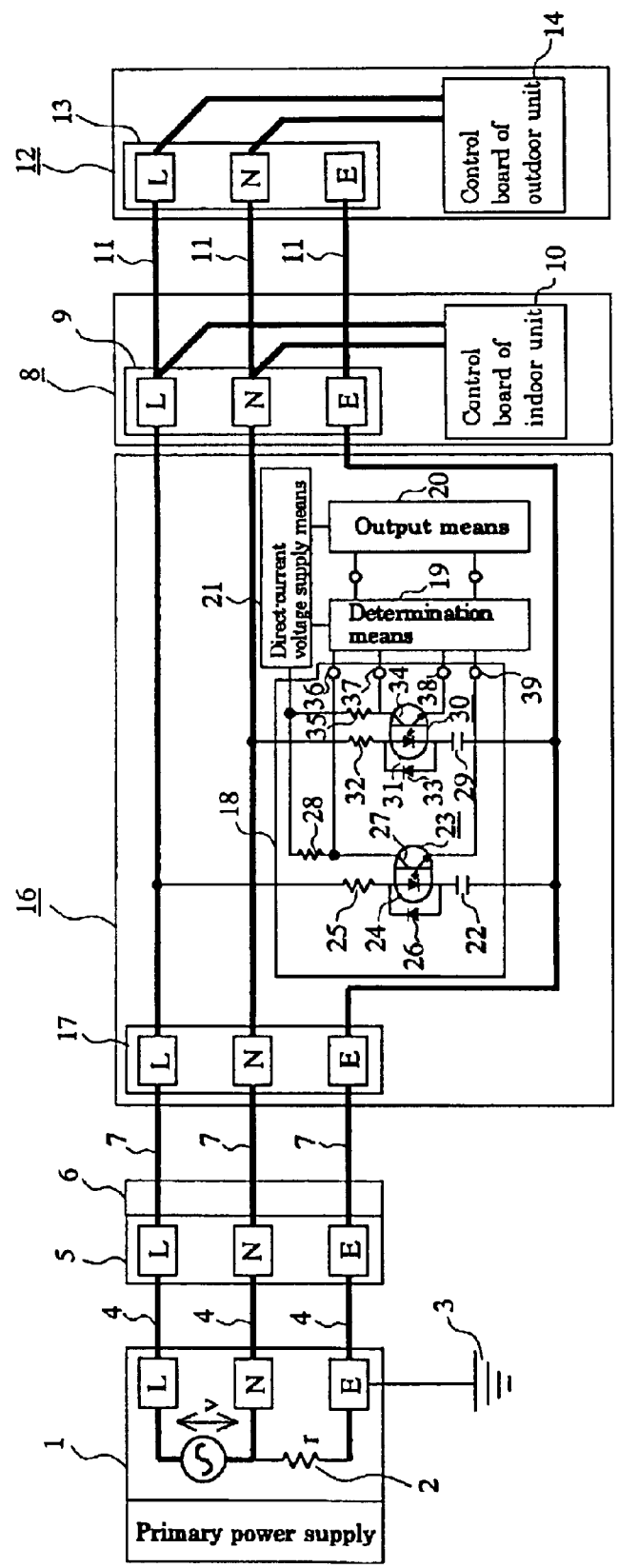
FIG. 2 is a power supply wiring diagram including the faulty wiring detection device for an air conditioner, where the electric signal detection means of FIG. 1 is described in detail.
Figure 3:
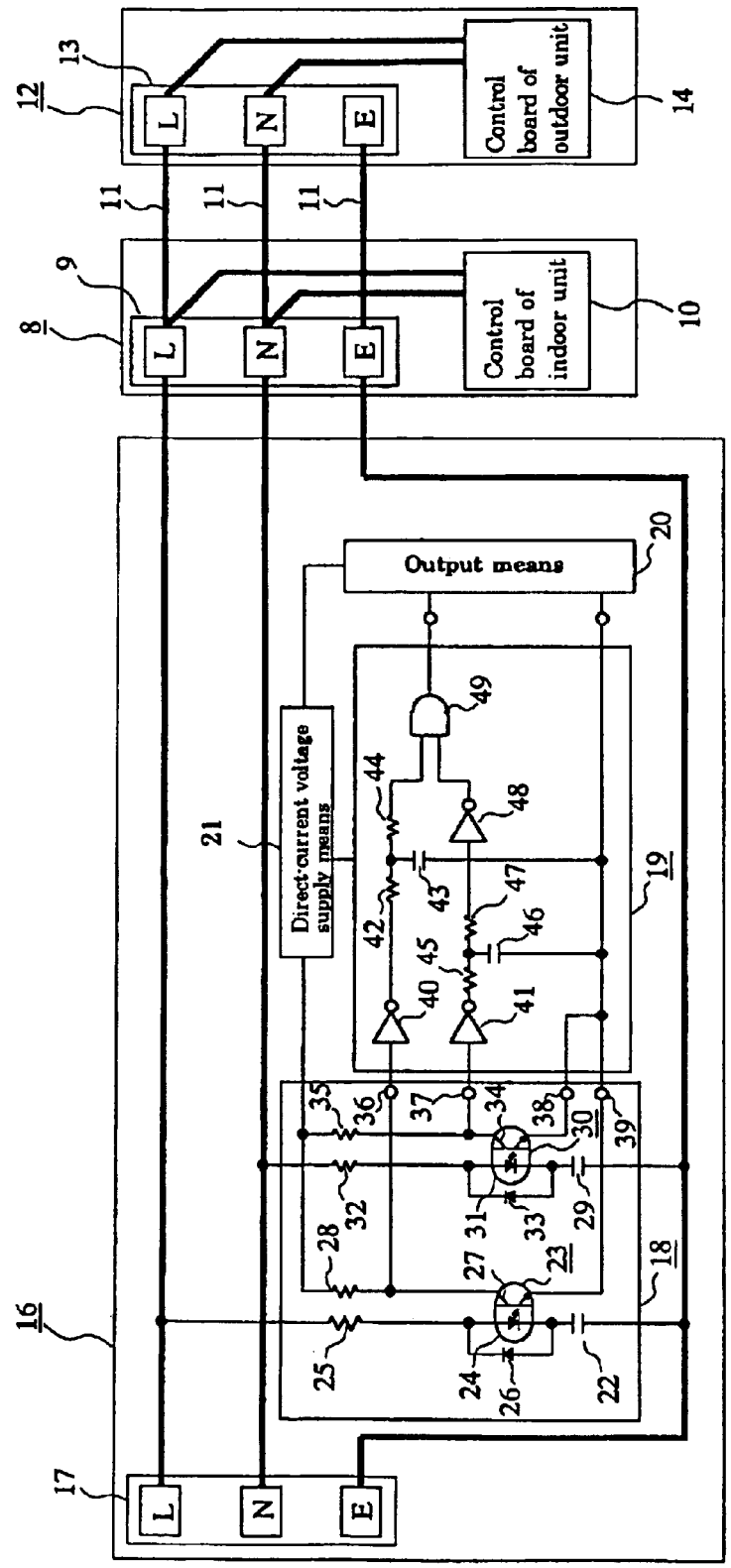
FIG. 3 is a power supply wiring diagram including the faulty wiring detection device for an air conditioner, where the electric signal detection means and determination means of FIG. 1 are described in detail.
Figure 4:
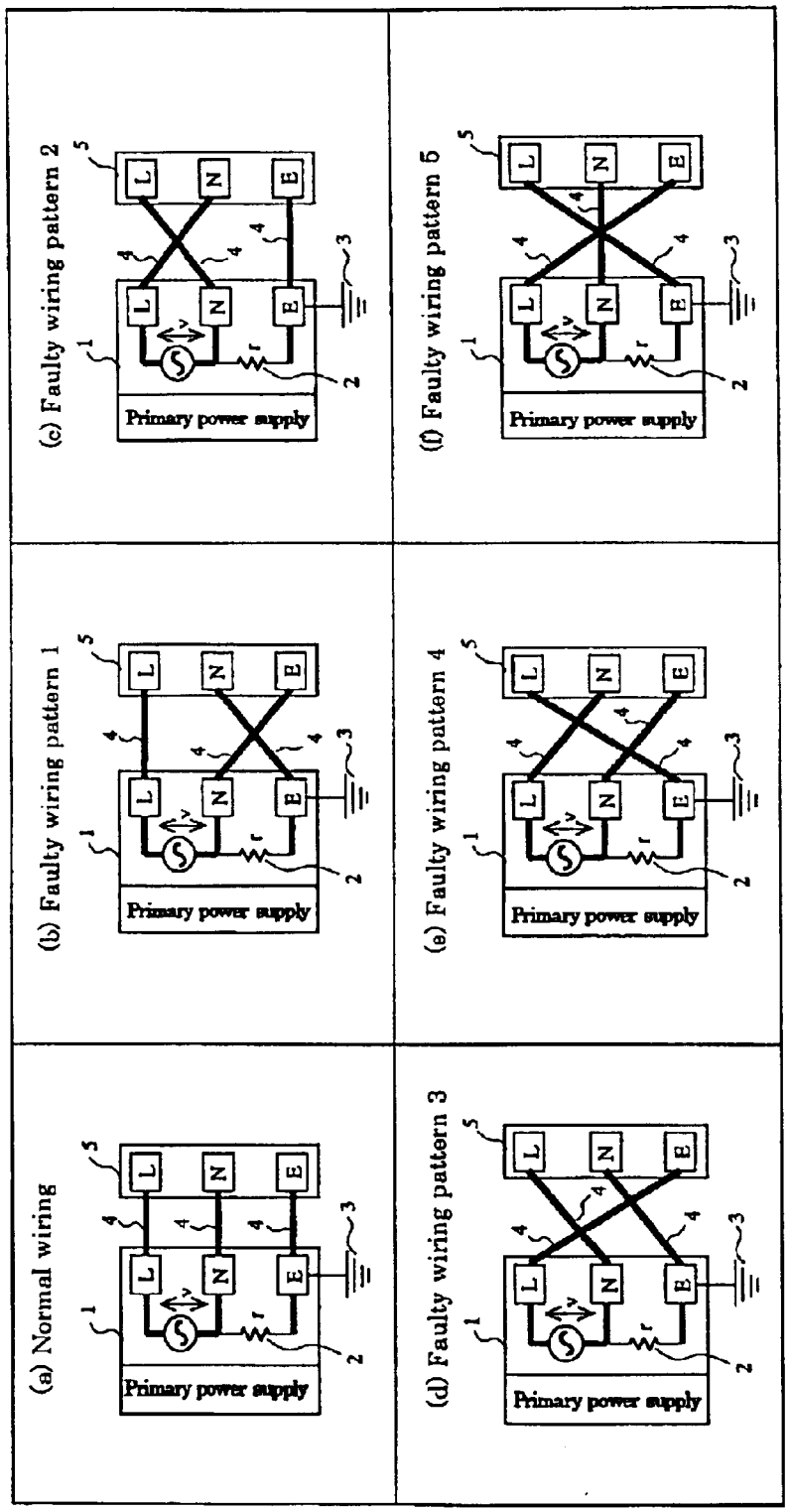
FIG. 4 shows wiring patterns of the power lines in the power supply wiring diagram including the faulty wiring detection device for an air conditioner in accordance with the first embodiment of the invention.
Figure 5:
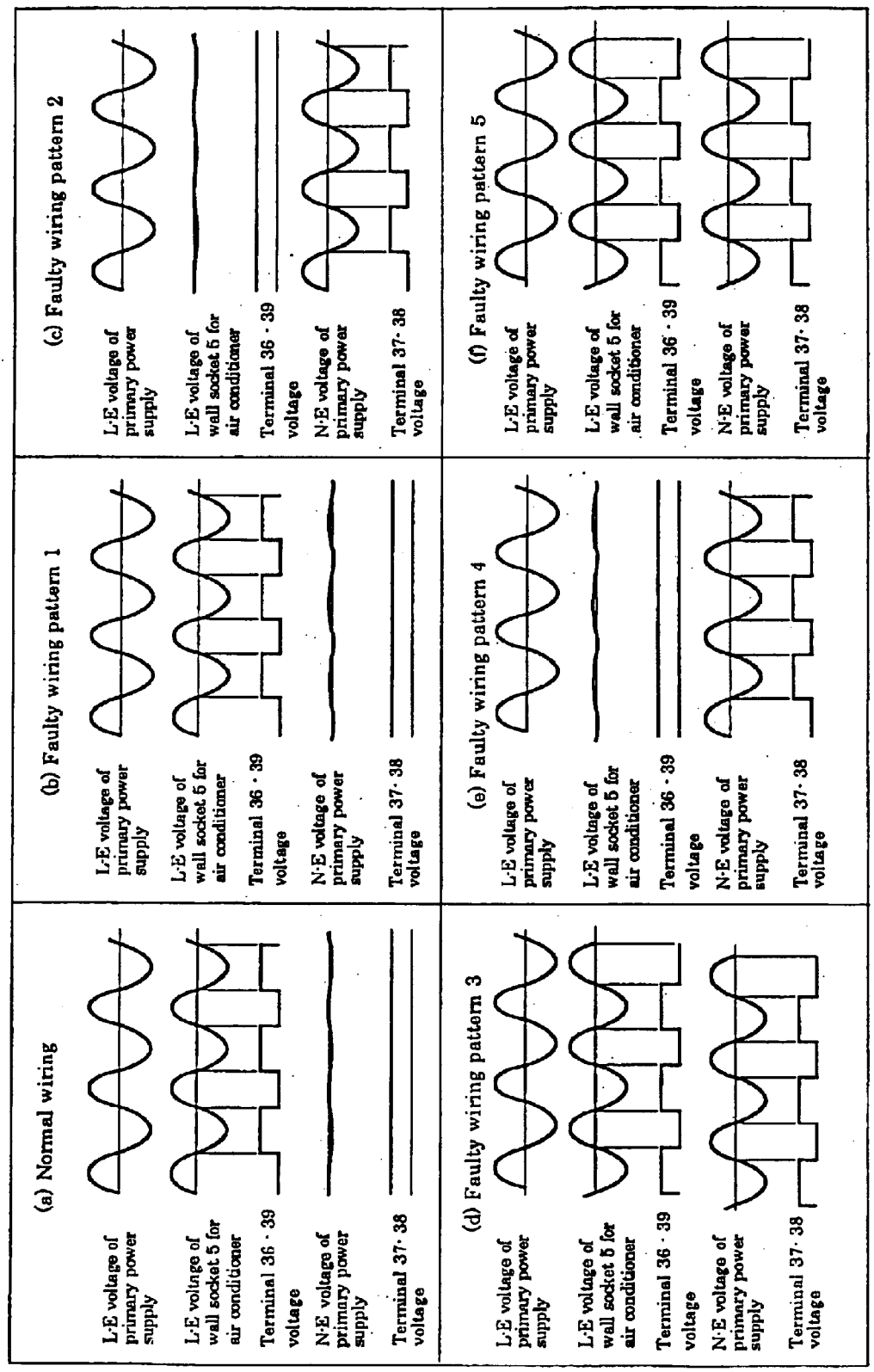
FIG. 5 shows waveforms of detection signals provided by the electric signal detection means of the faulty wiring detection device for an air conditioner in accordance with the first embodiment of the invention.

FIG. 1 is a power supply wiring diagram including a faulty wiring detection device for an air conditioner in accordance with a first embodiment of the present invention. FIG. 2 is a power supply wiring diagram including the faulty wiring detection device for an air conditioner, where electric signal detection means is described in detail. FIG. 3 is a power supply wiring diagram including the faulty wiring detection device for an air conditioner, where signal detection means and determination means are described in detail. FIG. 4 shows wiring patterns of the power lines. FIG. 5 shows the waveforms of detection signals provided by the electric signal detection means.

In FIG. 1, denoted 1 is a primary power supply that provides a single-phase alternating current, 2 a ground resistance existing between an N-phase of the primary power supply and a ground, 3 a ground point, 4 wiring from the primary power supply, 5 a wall socket for the air conditioner, 6 a power plug of the air conditioner, 7 a power cord of the air conditioner, 8 an indoor unit of the air conditioner, 9 a power supply terminal block of the indoor unit 8, 10 a control board of the indoor unit 8, 11 power supply wiring from the indoor unit 8 to an outdoor unit 12 of the air conditioner, 12 the outdoor unit of the air conditioner, 13 a power supply terminal block of the outdoor unit 12, 14 a control board of the outdoor unit 12, and 16 a faulty wiring detection device for an air conditioner.

Denoted 17 is a terminal block of the faulty wiring detection device 16 connected to the power plug 6 of the air conditioner, 18 electric signal detection means for reading out a signal for detecting faulty wiring of a power line, 19 determination means that receives the signal from the electric signal detection means and determines the presence/absence of faulty wiring, 20 output means for providing the determination result from the determination means as an output signal for a display or an alarm that works as external displaying/alarming means, and 21 direct-current voltage supply means for providing a direct-current voltage for the electric signal detection means and the determination means.

The primary power supply 1 in this embodiment is assumed to be, for example, a single-phase two-wire system, 100V of a single-phase three-wire system, or the single-phase power supply of a three-phase four-wire system having a neutral line as N-phase (its power supply voltage is regulated in each country).

The electric signal detection means 18 is configured as shown in FIG. 2, where denoted 23 is a photo-coupler connected between the L-phase and E on the terminal block 17 of the faulty wiring detection device 16 via a resistor 25 and a capacitor 22, 26 a diode connected in parallel to the photodiode 24 of the photo-coupler 23, and 27 a photo-transistor of which collector is connected to the direct-current voltage supply means 21 via a resistor 28 and emitter of which is connected to an output terminal 39.

Denoted 30 is a photo-coupler connected between the N-phase and E on the terminal block 17 via a resistor 32 and a capacitor 29, 33 a diode connected in parallel to the photodiode 31 of the photo-coupler 30, and 34 a photo transistor of which collector is connected to the direct-current voltage supply means 21 via a resistor 35 and emitter of which is connected to an output terminal 38. Denoted 36 is a terminal connected to a junction between the resistor 28 and the collector of the photo-transistor 27, while 37 is a terminal connected to a junction between the resistor 35 and the collector of the photo-transistor 34.

The determination means 19 has such a configuration shown in FIG. 3, where denoted 40 is a NOT circuit (inverter) that inverts a signal sent from the electric signal detection means, likewise 41 a NOT circuit that inverts the signal sent from the electric signal detection means, and 42, 43 and 44 are components constituting an integrator circuit that integrates the output from the NOT circuit 40, where 42 is a resistor, 43 a capacitor and 44 a resistor. Much like, 45, 46 and 47 constitute an integrator circuit that integrates the output sent from the NOT circuit 41, where 45 is a resistor, 46 a capacitor and 47 a resistor. Denoted 48 and 49 are logic circuits, where 48 is a NOT circuit and 49 an AND circuit.

It is possible to fabricate the electric signal detection means 18, determination means 19 and output means 20 all together on the control board of the air conditioner.

Next, the basic operation of the faulty wiring detection device 16 of the first embodiment is explained with reference to FIG. 1. The electric signal detection means 18 of the faulty wiring detection device 16 connected to the power plug 6 of the air conditioner detects the voltage or current between the L-phase and E of the power line as well as between the N-phase and E, and then provides signals according to the presence/absence of such voltage or current. The determination means 19 compares a pair of electric signals sent from the electric signal detection means with predetermined signal pairs for normal and faulty wirings, and then determines whether the current wiring is normal or faulty. Since it is powered by the direct-current voltage supply means 21 during determination, it can determine the state of wiring even if the power line is improperly connected.

The determination result obtained by the determination means 19 is sent to the output means 20. Then the output means 20 drives a display unit (for example, LED or lamp) or an acoustic unit (for example, buzzer or speaker) to notify persons at the site, such as an installation engineer of an air conditioner, of the presence/absence of faulty wiring, and eventually prevents problems posed by faulty wiring.

Next, the details of the operation are described with reference to FIGS. 2–5. As shown in FIG. 4, there are five patterns of faulty wiring for the power lines 4 connected to the primary power supply 1. FIG. 4(a) shows normal wiring, while FIGS. 4(b)–4(f) show faulty wiring patterns. The waveforms of the detection signals in the electric signal detection means 18 shown in FIG. 5 correspond to the wiring patterns shown in FIG. 4, respectively. Namely, FIGS. 5(a)–5(f) show the waveform diagrams of the detection signals corresponding to FIGS. 4(a)–(f), respectively.

First, the operation of the electric signal detection means 18 of the faulty wiring detection device 16 is explained below. The resistance(referred to as "R") of the resister 25 and the capacitance (referred to as "C") of the capacitor 22 of the series circuit made of the resistor 25, photodiode 24 of the photo-coupler 23 and the capacitor 22 connected between the L-phase and E on the terminal block 17 ate determined to meet the following expression (1), where V is the voltage(effective value) of the primary power supply 1 and ω(omega) is the angular frequency of the primary power supply.

(Expression 1)

$$\frac{2V}{\sqrt{R^2 + \left(\frac{1}{\omega C}\right)^2}} + \text{macimum leak current of the air conditioner determined by the government of each country} < \text{regulated value}$$
(Expression 1)

The above regulated value of leak current is determined by the government of each country.

The photo-coupler 23 of an appropriate amplification factor is chosen, with its ON/OFF characteristics being taken into account. If a current large enough for ON/OFF operations of the photo-coupler 23 runs in the photodiode 24, meeting the requirement shown by the expression (1), then the photo-transistor 27 turns ON/OFF. The capacitor 22 is connected to electrically insulate the L-phase of the power line from E. The diode 26 is coupled in parallel with the photo-coupler 23 to protect the photo-coupler from a reverse voltage that exceeds its reverse withstand voltage.

Since the output of the photo-transistor 27 is provided from the direct-current voltage supply means 21 via the resistor 28, its output voltage falls to near zero when the photo-coupler 23 is turned on, while it becomes equal to the direct-current voltage provided by the direct-current voltage supply means 21 when the photo-coupler 23 is turned off. This output voltage is entered to the determination means 19 via the terminals 36 and 39.

The resistance (referred to as "R") of the resistor 32 and the capacitance (referred to as "C") of the capacitor 29 of the series circuit made of the resistor 32, photodiode 31 of the photo-coupler 30 and the capacitor 29 connected between the N-phase and E on the terminal block 17 of the electric signal detection means 18 of the faulty wiring detection device 16 are determined to meet the condition shown by the expression (1). Then the current that effects ON/OFF of the photo-coupler 30 runs in the photodiode 31 and the photo-transistor 34 turns ON/OFF. Since the currents running in the photodiodes 24, 31 on the primary side of the photo-couplers 23, 30 are alternating currents, the output changes with time. Namely, the photo-couplers 23, 30 repetitive are turned ON only during the half cycle of the waveform of the primary power supply and turned off during the other half cycle thereof. In this way, the output voltages of the photo-couplers 23, 30 show ON/OFF pulse waveforms.

Since the output of the photo-transistor 34 is provided as a voltage supplied by the direct-current voltage supply means 21 via the resistor 35, its voltage falls to near zero, when the photo-coupler 30 is turned on, while it becomes equal to the direct-current voltage provided by the direct-current voltage supply means 21 when the photo-coupler 30 is turned off. This output voltage is entered to the determination means 19 via the terminals 37, 38.

If the combinations of the output voltages of the photo-couplers 23, 30 are expressed by means of sets, there are four combinations, {(ON, ON), (ON, OFF), (OFF, ON), (OFF, OFF)}. The combinations of the output voltages are shown in FIG. 5. The normal wiring of FIG. 5(a) and the faulty wiring of FIG. 5(b) show the same output pattern, while the other faulty wirings show different output patterns from that of the normal wiring. Thus such faulty wirings can be distinguished from the normal wiring even by a simple logic circuit.

Provided that the appropriate resistors 25, 32 and capacitors 22, 29 are chosen, it is possible to limit the current flowing to the ground line below a regulated value for leak current.

Next, the operation of the determination means 19 is explained with reference to FIGS. 3–5.

FIGS. 5(*a*)–5(*f*) show the waveforms of L-E voltage of the primary power supply 1, L-E voltage of the wall socket 5 for the air conditioner, voltage between the terminals 36 and 39, N-E voltage of the primary power supply 1, and voltage between the terminals 37 and 38.

Since the currents running in the photodiodes 24, 31 on the primary side of the photo-couplers 23, 30 in the electric signal detection means 18 are alternating currents, the output changes with time. Namely, the photo-couplers 23, 30 are turned ON only during the half cycle of the waveform of the primary power supply and turned off during the other half cycle thereof. In this way, the output voltages of the photo-couplers 23, 30 show repetitive ON/OFF pulse waveforms.

When the electric signal detection means 18 provides the determination means 19 with signals with such waveforms of the terminal 36–39 voltage and terminal 37–38 voltage as shown in FIGS. 5A–5F, the NOT circuits 40, 41 invert the terminal 36–39 voltage and terminal 37–38 voltage and output them. This output signals represent ON/OFF states of the photo-transistors 27, 34 of the photo-couplers 23, 30.

Although this output signal has a pulse waveform, a set of stable output signals that do not change with time is provided by converting the pulse waveform into a square waveform. To simplify the circuit structure, the NOT circuit 40 is coupled with the integrator circuit composed of the resistors 42, 44 and capacitor 43. This integrator circuit converts pulse waveforms into square waveforms.

Similarly, the NOT circuit 41 is coupled with the integrator circuit composed of the resistors 45, 47 and capacitor 46, and this integrator circuit converts pulse waveforms into square waveforms.

If the constant of each component in the integrate circuit for the NOT circuits 40, 41 is selectively determined so that a pulse waveform is converted into a square waveform, the ON/OFF pulse waveforms of the photo-couplers 23, 30 become stable at the voltage Vcc that is provided by the direct-current voltage supply means 21. Meanwhile, zero volts are provided when the photo-couplers 23, 30 are turned off. The voltage waveform between the terminals 36 and 39 shows Vcc when it passes the NOT circuit 40 and the integrator circuit for the case of normal wiring. On the other hand, the voltage waveform between the terminals 37 and 38 shows zero when it passes the NOT circuit 41 and the integrator circuit. With the voltages Vcc and zero being represented by "H" and "L", respectively, the voltage provided by entering the output of the electric signal detection means 18 to the NOT circuits 40, 41 of the determination means 19 and the individual integrator circuits shows the patterns listed on Table 1 for the combinations of the normal and faulty wirings of wiring patterns of FIG. 4 and for the resulting outputs of FIG. 5. Table 1 is a truth table.

In this case, the faulty wiring pattern 1 shown in (b) where the power line and the ground line are exchanged can be regarded as equal to the normal wiring shown in (a). Provided that the above combinations of the output voltages are expressed by a logical expression that provides "H" for normal wiring, the determination results become as follows. The involved logic circuits are the NOT circuit 48 and the AND circuit 49 shown in FIG. 3.

(Expression 2)
Determination result=A·$\overline{B}$

TABLE 1

| Wiring pattern | Voltage between the terminals 36 and 39 after passing the NOT circuit and the integrator circuit (A) | Voltage between the terminals 37 and 38 after passing the NOT circuit and the integrator circuit (B) |
| --- | --- | --- |
| (a) Normal wiring | H | L |
| (b) Faulty wiring pattern 1 | H | L |
| (c) Faulty wiring pattern 2 | L | H |
| (d) Faulty wiring pattern 3 | H | H |
| (e) Faulty wiring pattern 4 | L | H |
| (f) Faulty wiring pattern 5 | H | H |

In this manner, a determination result "H" is sent to the output means 20 in the case of normal wiring, while "L" is sent in the case of faulty wiring. If the reverse results are necessary in the output, a NAND circuit instead of the AND circuit 49 is used. A circuit of wide use can be configured by changing the output means 20, such as an alarm, alarm lamp or relay connected to another apparatus, depending on an external apparatus for outputting when a determination result is sent to the output means 20.

If the capacitances of the capacitors 22, 29 in the electric signal detection means 18 are appropriately set, the resistors 25, 32 may be eliminated and the same result is provided.

In this manner, the status of wiring can be determined whether normal or faulty, using the table that describes the combinations of wiring pattern and output result.

Table 1 can be used for the power supply systems including the single-phase two-wire 100V and 200V systems, single-phase three-wire 100V system, and single-phase two-wire system using the neutral line of a three-phase four-wire system as the N-phase. Meanwhile, for the single-phase three-wire 200V system, Table 1 takes the form of different truth table, Table 2. Thus each determination result is provided by the following expression.

(Expression 3)
Determination result=$\overline{A}$·$\overline{B}$

TABLE 2

| Wiring pattern | Voltage between the terminals 36 and 39 after passing the NOT circuit and the integrator circuit (A) | Voltage between the terminals 37 and 38 after passing the NOT circuit and the integrator circuit (B) |
| --- | --- | --- |
| (a) Normal wiring | L | L |
| (b) Faulty wiring pattern 1 | H | L |
| (c) Faulty wiring pattern 2 | L | L |
| (d) Faulty wiring pattern 3 | H | L |
| (e) Faulty wiring pattern 4 | L | H |
| (f) Faulty wiring pattern 5 | L | H |

Therefore, in case of the single-phase three-wire system, the logic circuits of the determination means are modified to perform the same determination as that described above. It thereby becomes possible to detect faulty wiring.

According to this embodiment, it becomes possible to notify the installation engineer of the presence/absence of faulty wiring in the power line of the primary power supply by means of a display or an alarm, for example, during the installation of an air conditioner. Eventually, the problems such as overheating of the improperly wired circuit can be prevented.

In this embodiment, the electric signal detection means 18 comprises the resistors 25, 32, capacitors 22, 29 and photo-couplers 23, 30. However, it may be formed by either combination of resistors and photo-couplers or of capacitors and photo-couplers for simplified structure.

Embodiment 2

Figure 6:
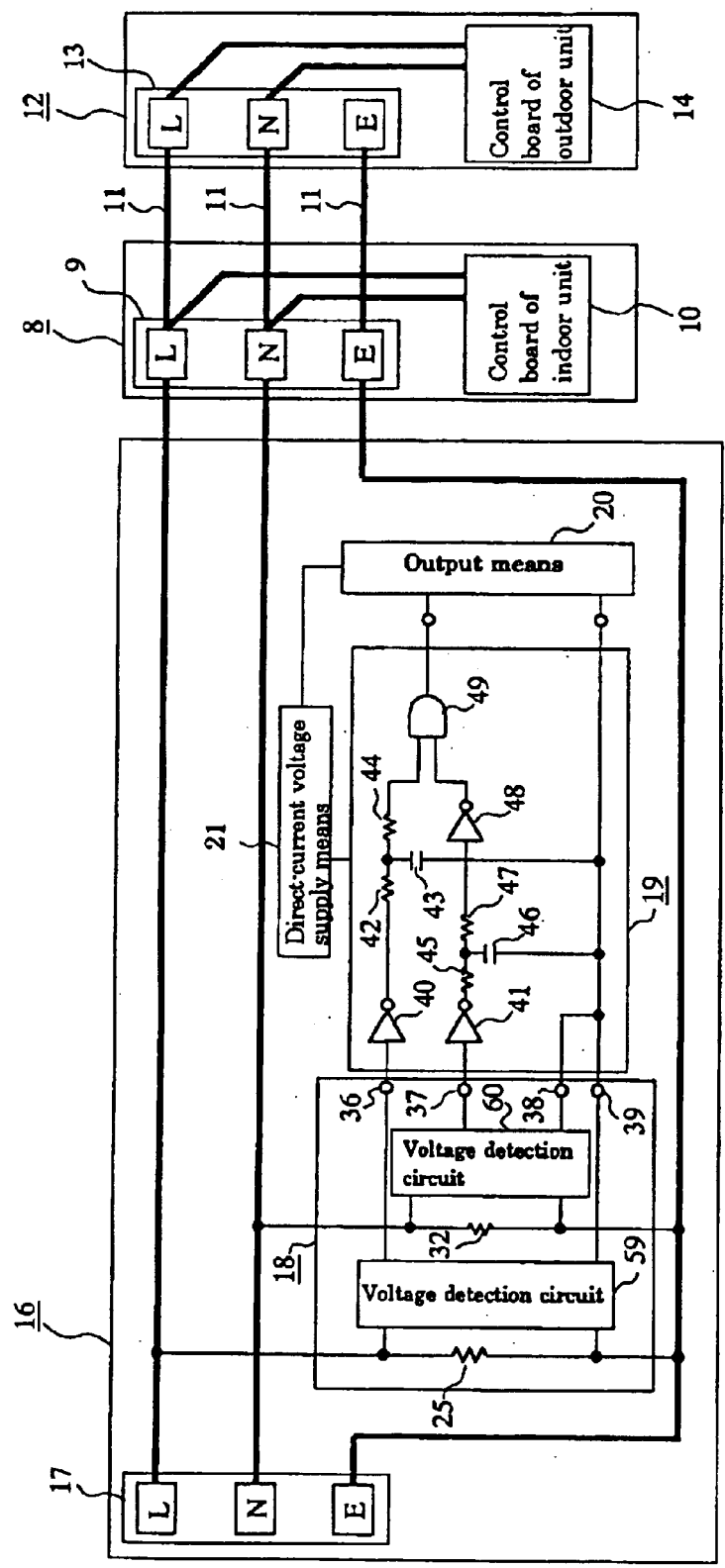
FIG. 6 is a power supply wiring diagram including a faulty wiring detection device for an air conditioner in accordance with a second embodiment of the present invention.

FIG. 6 is a power supply wiring diagram including a faulty wiring detection device for an air conditioner in accordance with a second embodiment of the present invention. In the first embodiment, the electric signal detection means using photo-couplers has been described. Meanwhile, in the second embodiment electric signal detection means uses resistors and capacitors.

In FIG. 6, the same numerals are given to the same components as or similar components to those in FIG. 3 of the first embodiment, and their explanation is not repeated. In the electric signal detection means 18, denoted 59 is a voltage detection circuit that detects a voltage across the resistor 25 connected between the L-phase and E, while 60 is a voltage detection circuit that detects a voltage across the resistor 32 connected between the N-phase and E. The other part of the electric signal detection means 18 is the same as that of the first embodiment.

In this configuration, the voltage detection circuits 59 and 60 provide ON/OFF signals for the determination means 19 when a voltage is applied between the L-phase and E and between the N-phase and E, respectively. The voltage detection circuits 59, 60 detect voltages by connecting both ends of each of the resistors 25, 32 to a transistor and setting ON/OFF output conditions.

The output voltages provided from the voltage detection circuits 59, 60 are sent to the determination means 19. Then, likewise the operation described in the first embodiment, the wiring is determined whether normal or faulty and problems such as overheat in the circuit can be prevented.

Embodiment 3

Figure 7:
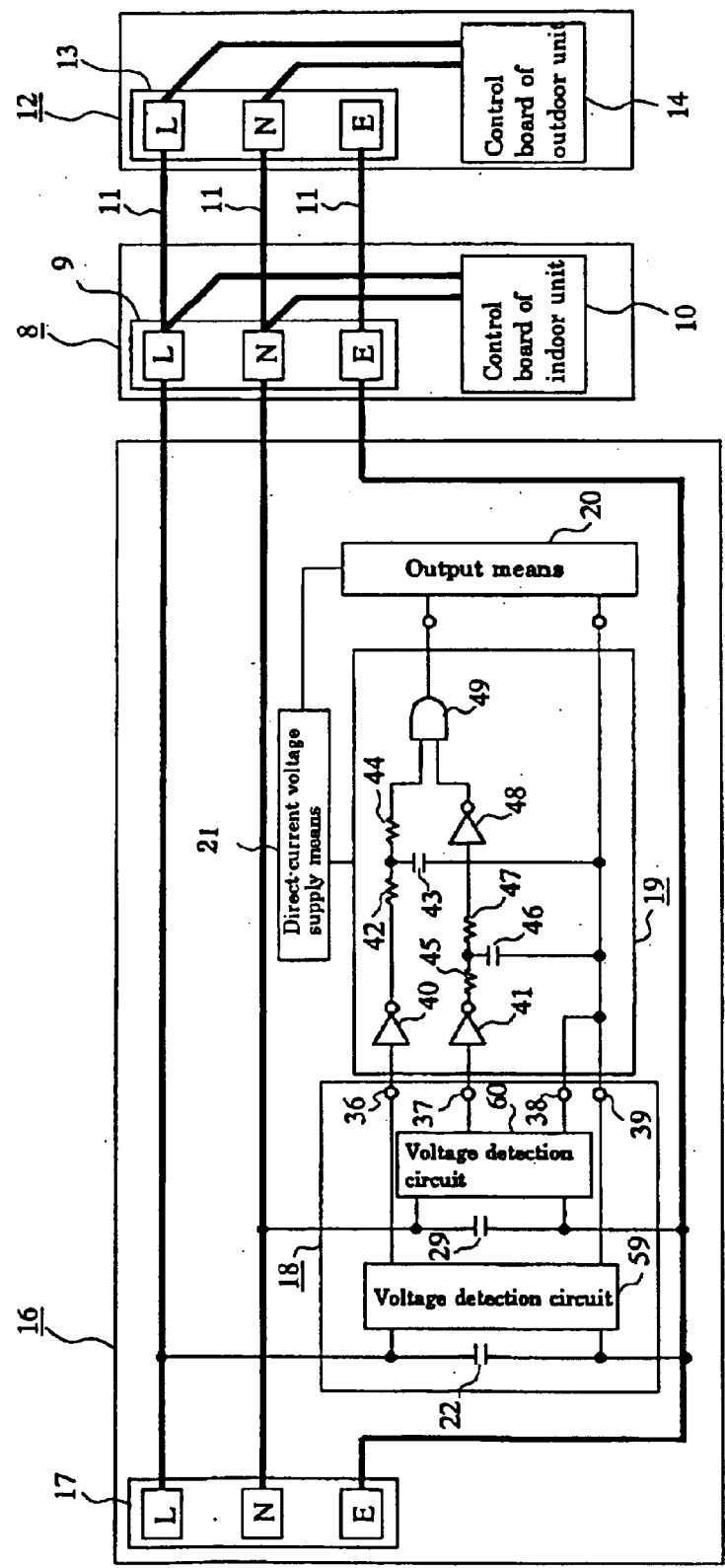
FIG. 7 is a power supply wiring diagram including a faulty wiring detection device for an air conditioner in accordance with a third embodiment of the present invention.

FIG. 7 is a power supply wiring diagram including a faulty wiring detection device for an air conditioner in accordance with a third embodiment of the present invention. As described in the second embodiment, when the electric signal detection means employs resistors 25, 32, these resistances serve as the insulation resistance. Thus, in order to meet the requirements of the insulation resistance tests based on various safety standards for electric machinery and apparatus, and electric parts (Electrical Appliance and Material Control Law of Japan and overseas standards for safety like, IEC, UL, CSA, TUN, and BSI), resistors of a considerably large resistance must be employed in the circuit. Because such resistors may cause noise problems, this embodiment employs capacitors 22, 29 instead of the resistors 25, 32.

If capacitors are connected, it becomes possible to use resistors of a lower resistance or even eliminate resistors for ensuring a required insulation. At the same time, it is possible to meet safety requirements by determining an appropriate capacitance for each of the capacitors through calculation.

In Japan, the power supply voltage may be either 100V or 200V in the single-phase three-wire system as well as the single-phase two-wire system. Thus, according to the power supply voltage, the capacitances of the capacitors 22, 29 constituting the electric signal detection means 18 may be changed; or a resistor is serially connected to each of the capacitors 22, 29 and the resistance of each resistor may be changed with no change to the capacitances of the capacitors 22, 29. Here, if a plurality of the same capacitors are connected, it has the same effect as changing the size of capacitance of a capacitor.

It is another option to connect the L-phase and E and the N-phase and E, respectively, each via a capacitor for insulation, and insert a resistor serially connected to each capacitor, in order to meet the requirements of insulation resistance tests based on various safety standards for electric machinery and apparatus, and electric parts. At the same time, by determining appropriate capacitance and resistance through calculation and changing the resistance of each resistor according to each power supply voltage, it becomes possible to meet the requirements for leak current without replacing the capacitors.

Embodiment 4

Figure 8:
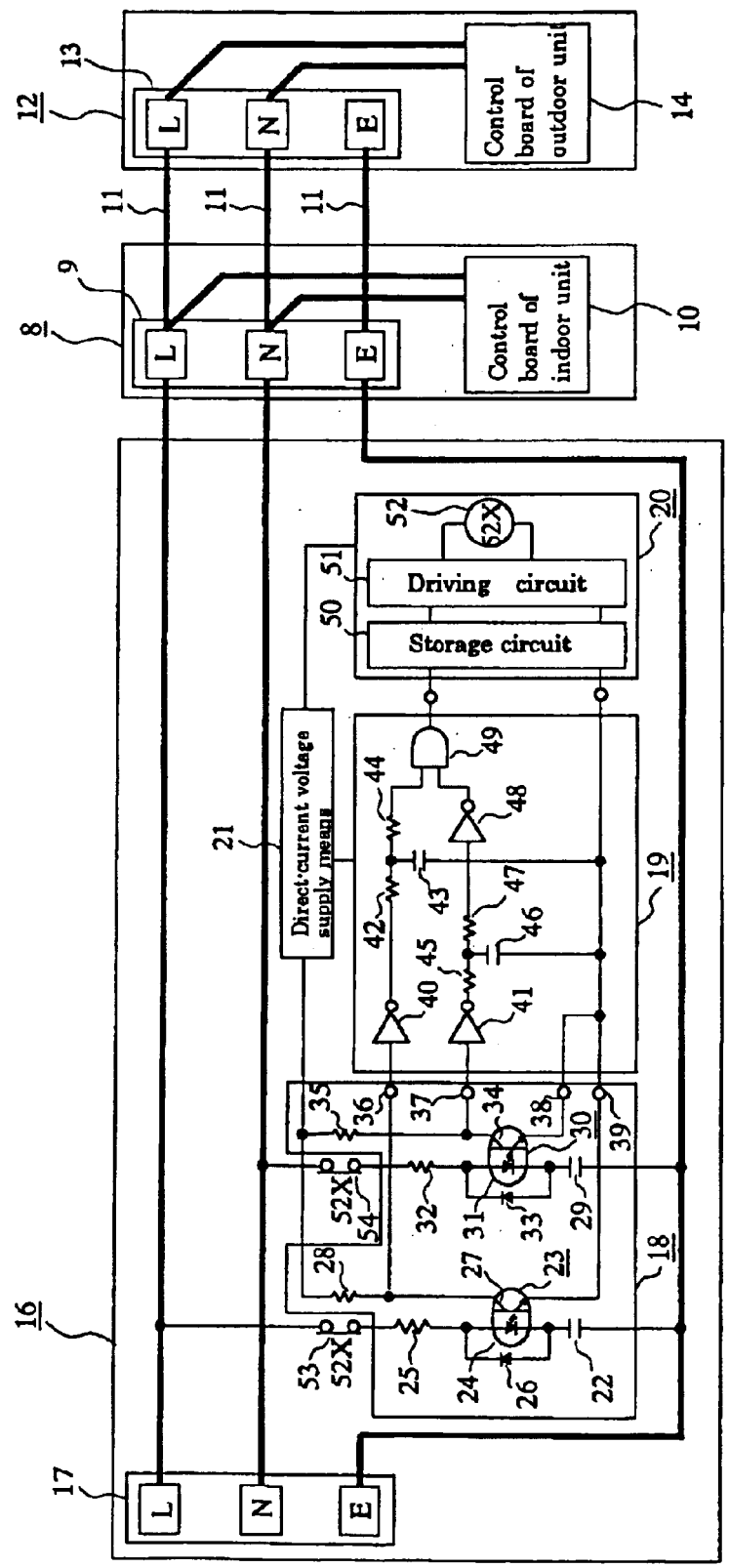
FIG. 8 is a power supply wiring diagram including a faulty wiring detection device for an air conditioner in accordance with a fourth embodiment of the present invention.

FIG. 8 is a power supply wiring diagram including a faulty wiring detection device for an air conditioner in accordance with a fourth embodiment of the present invention. When the electric signal detection means 18 yields a leak current in the ground line, the operation of the air conditioner may be affected. To eliminate such risk, this embodiment provides an improvement for detecting faulty wiring without affecting the operation of the air conditioner.

In FIG. 8, the same numerals are given to the same components as or similar components to those in FIG. 3 of the first embodiment, and their explanation is not repeated. The first embodiment has indicated that the output means 20 may be a display (such as LED and lump), an acoustic device (such as a buzer), or provision of signals for a relay to external devices. On the other hand, in the present embodiment the output means 20 is composed of a self-holding circuit 50 (such as a flip-flop circuit) that temporarily retains the output from the determination means 19 and a driving circuit 51 that drives a relay 52.

Denoted 53 is shut-off means that is inserted between the L-phase and E of the power line of the electric signal detection means and comprises a relay 52X, while 54 is shut-off means that is inserted between the N-phase and E of the power line of the electric signal detection means and comprises a relay 52X. The relay 52X uses a b-contact.

In this configuration, it is possible to drive the relay 52X with the relay driving circuit 51, while temporarily holding the output from the determination means 19 by means of the self-holding circuit 50 of the output means 20. Thereby, the L-phase and N-phase of the power line for the electric signal detection means 18 can be shut off from E, using the shut-off means 53, 54. Then the duration time that the electric signal detection means 18 makes a leak current run in the ground line is minimized, and it thereby becomes possible to detect faulty wiring without affecting the operation of the air conditioner.

Embodiment 5

Figure 9:
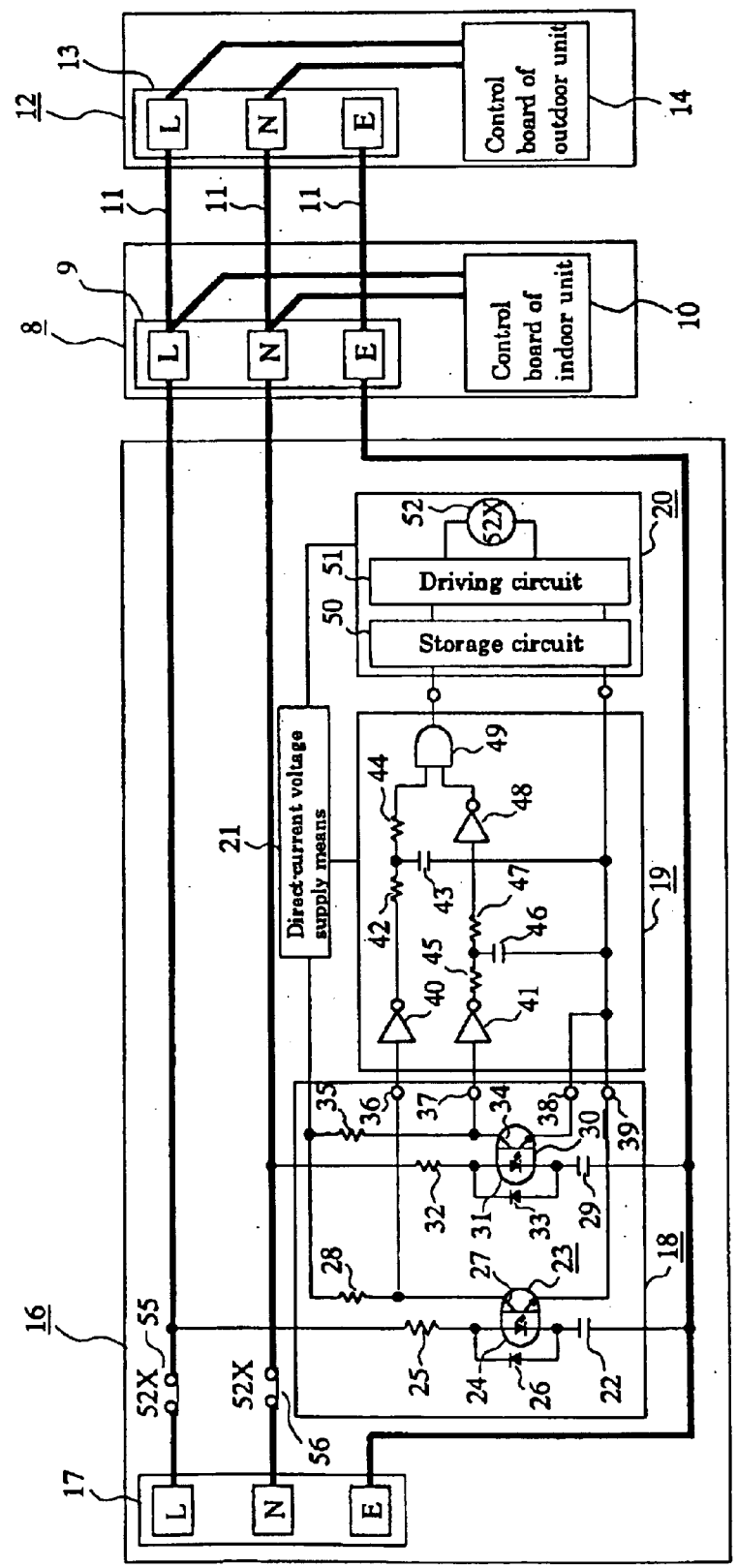
FIG. 9 is a power supply wiring diagram including a faulty wiring detection device for an air conditioner in accordance with a fifth embodiment of the present invention.

FIG. 9 is a power supply wiring diagram including a faulty wiring detection device for an air conditioner in accordance with a fifth embodiment of the present invention. In the fourth embodiment, the L-phase and N-phase of the electric signal detection means are shut off from E. In this embodiment, however, the power line itself is shut off. In FIG. 9, the same numerals are given to the same components as or similar components to those in FIG. 8 of the fourth embodiment, and their explanation is not repeated.

Denoted 55 is shut-off means that is provided for the L-phase of the power line and comprises a relay 52X, while 56 is shut-off means that is provided for the N-phase of the power line and comprises a relay 52X. The relay 52X uses a b-contact.

In this configuration, the relay 52X is driven by the relay driving circuit 51, with the output from the determination means 19 being retained temporarily in the self-holding circuit 50 of the output means 20, and the shut-off means 55, 56 shut off the respective connections of the L- and N-phase of the power line to disconnect the power line from the air conditioner. Since the wiring on the air conditioner side is disconnected, it is possible to prevent problems arising from faulty wiring. Besides, since no power is provided for the air conditioner, the air conditioner is not activated and the safety in case of faulty wiring is further improved.

Embodiment 6

Figure 10:
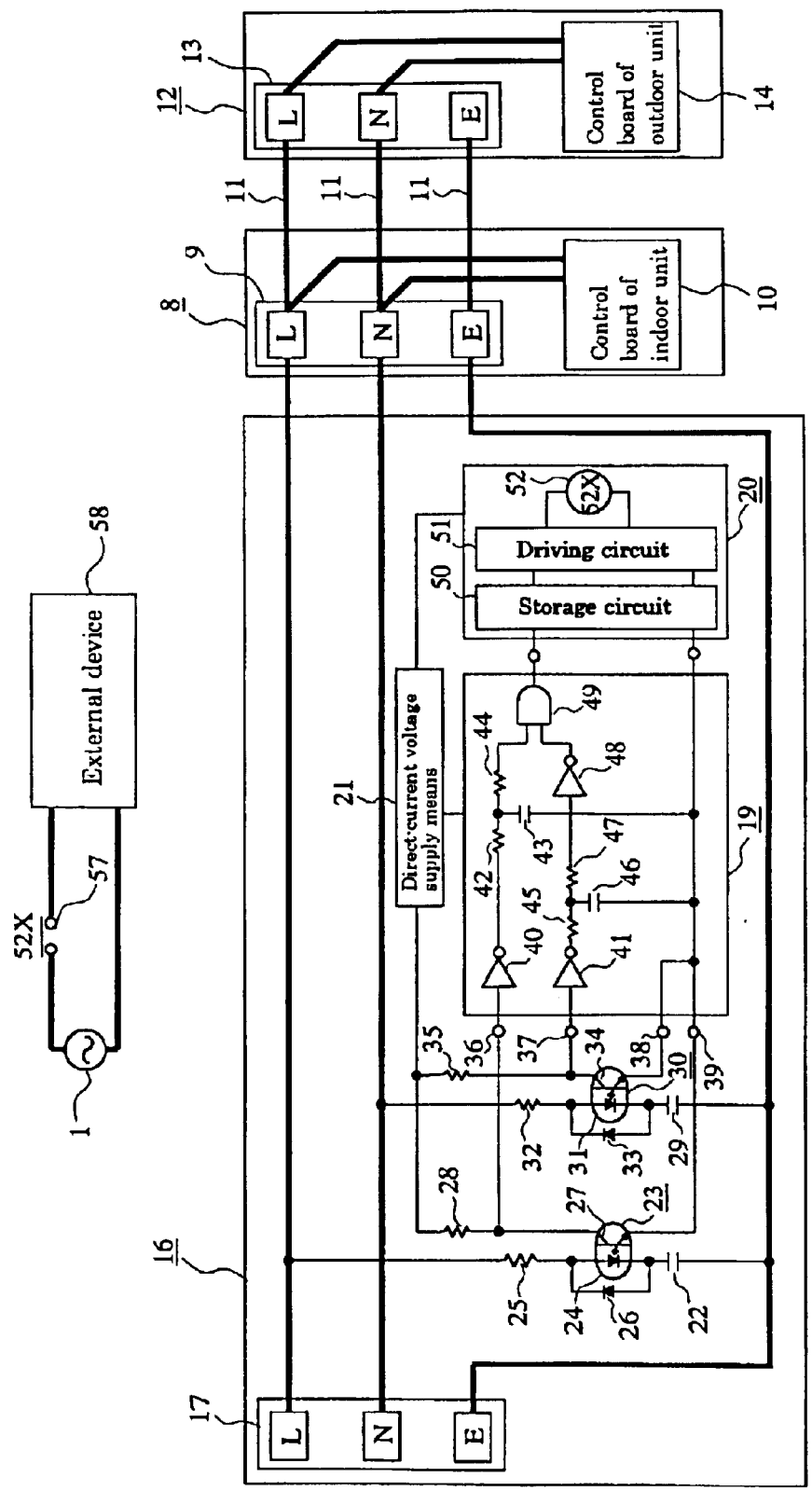
FIG. 10 is a power supply wiring diagram including a faulty wiring detection device for an air conditioner in accordance with a sixth embodiment of the present invention.
Figure 11:
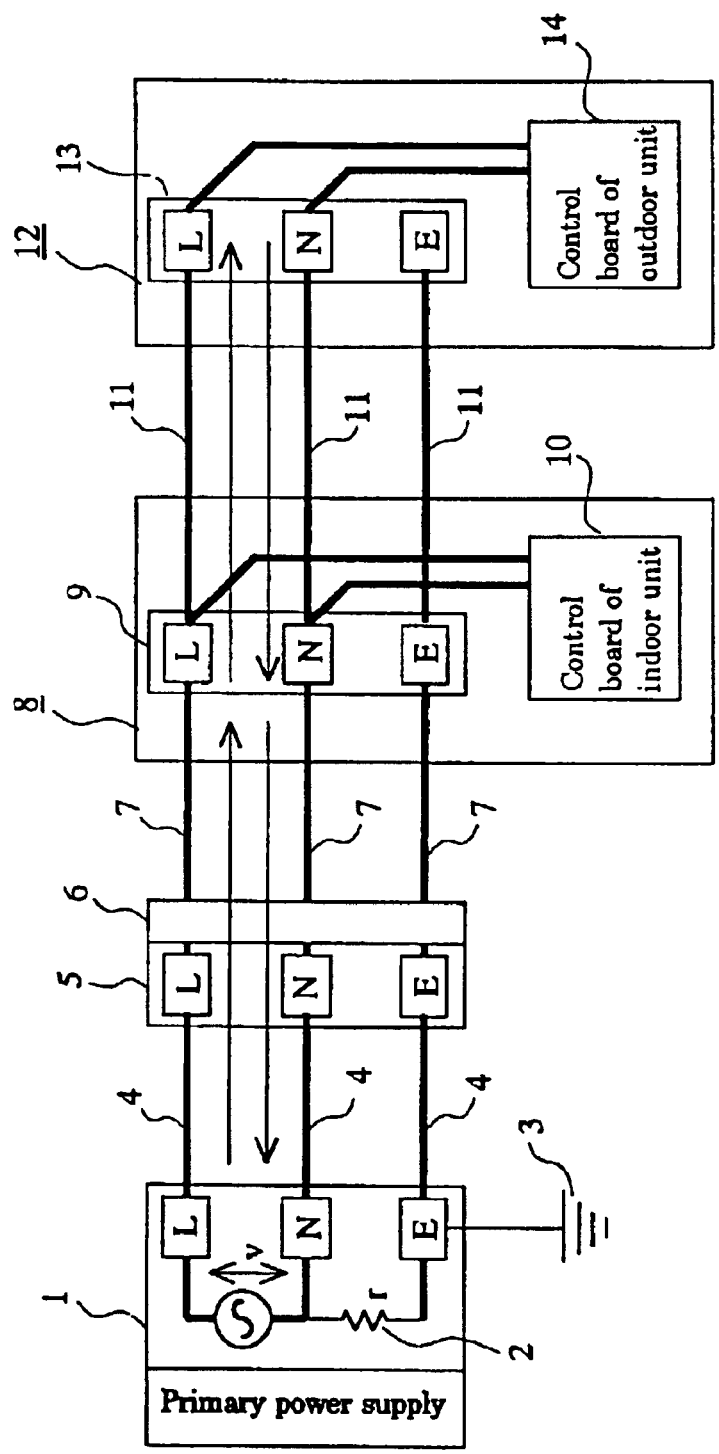
FIG. 11 is a power supply wiring diagram illustrating the normal wiring in a prior art air conditioner.
Figure 12:
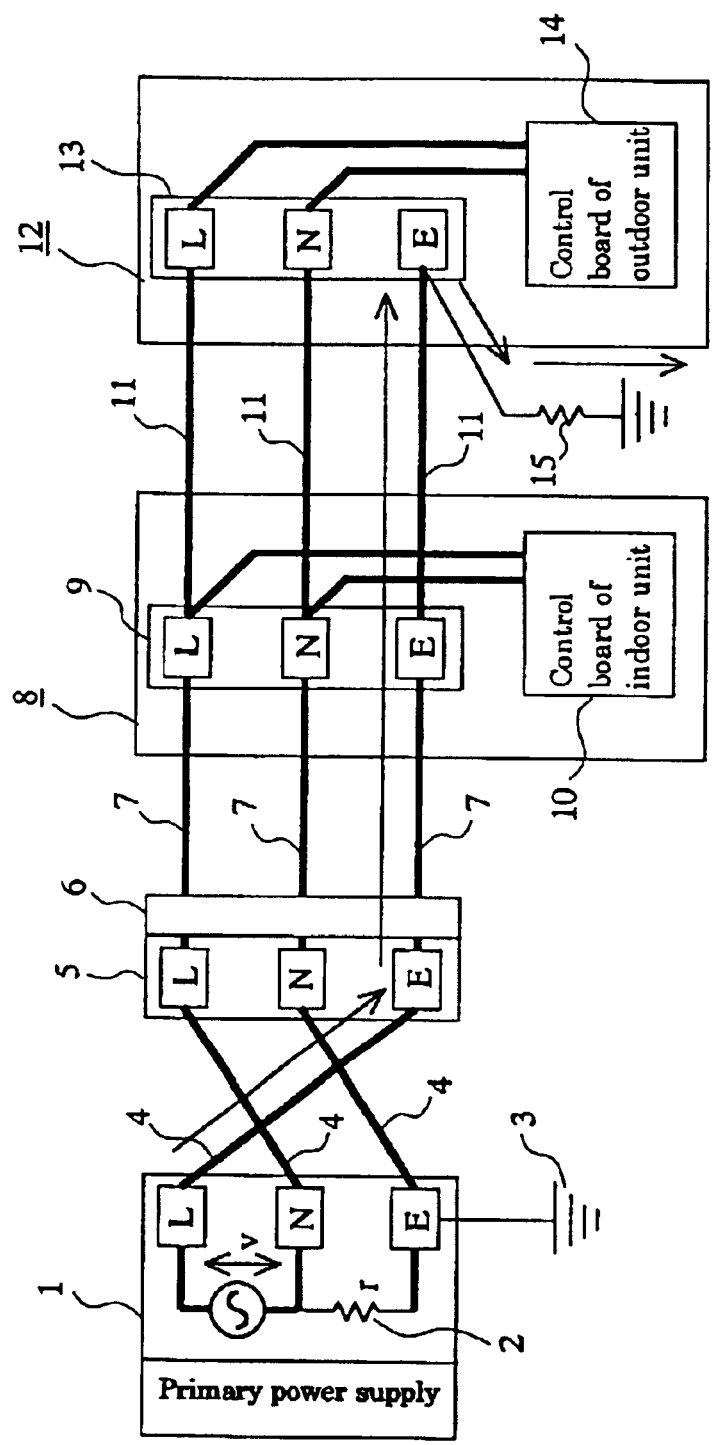
FIG. 12 is a power supply wiring diagram showing faulty wiring in the prior art air conditioner.
Figure 13:
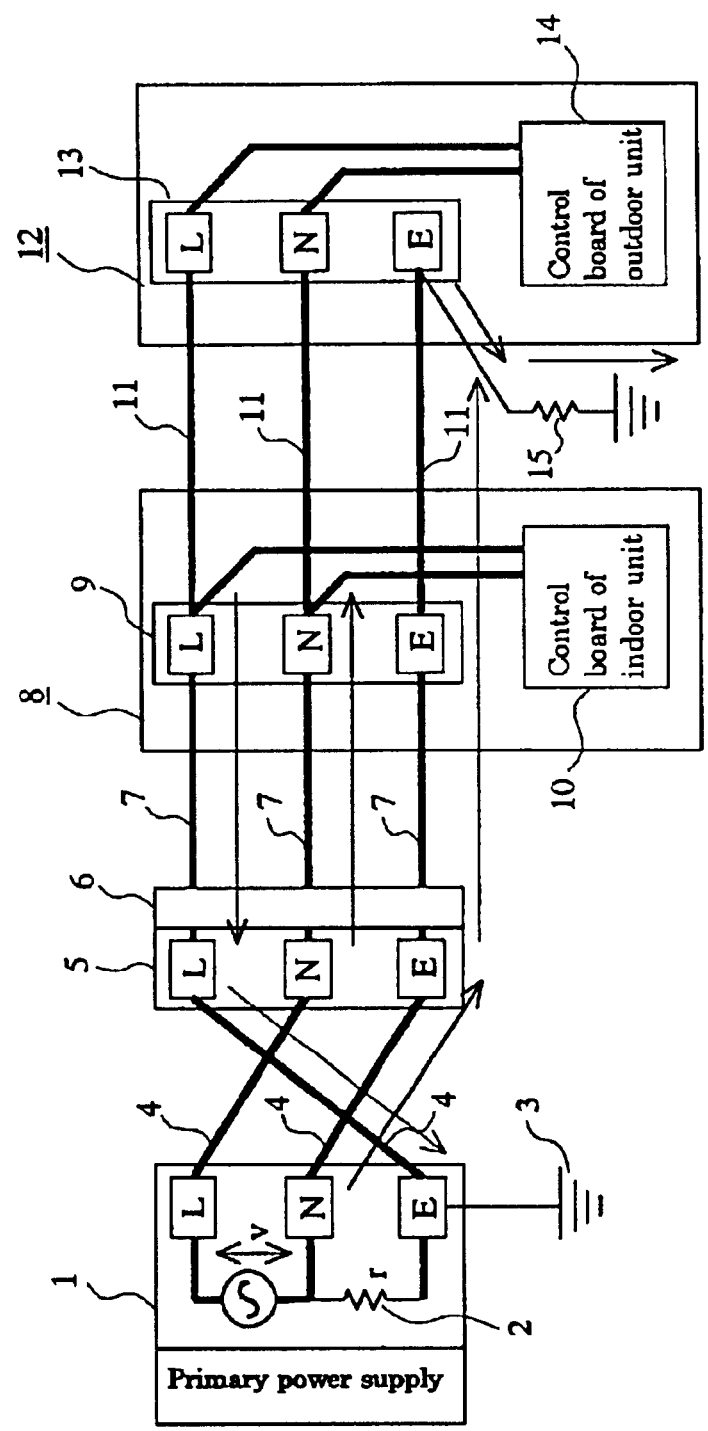
FIG. 13 is a power supply wiring diagram showing faulty wiring in the prior art air conditioner.

FIG. 10 is a power supply wiring diagram including a faulty wiring detection device for an air conditioner in accordance with a sixth embodiment of the present invention. In this embodiment, the output means controls an external device. In FIG. 10, the same numerals are given to the same components as or similar components to those in FIG. 9 of the fifth embodiment, and their explanation is not repeated. Denoted 58 is an external device and 57 shut-off means comprising a relay 52X installed between the primary power supply 1 and the external device 58.

According to this configuration, such operation becomes possible that the external device 58 deactivates the shut-off means 57 in the case of normal wiring while activating it in the case of faulty wiring. In accordance with the types and use of the external device, the contact of the relay 52X may be chosen from a-contact and b-contact.

According to the present invention, the faulty wiring detection device for detecting faulty wiring of an air conditioner which is powered by a single-phase two-wire system, a single-phase three-wire system, or a single-phase lower voltage of a three-phase four-wire system, comprises: electric signal detection means for detecting an electric signal in between a ground line, a neutral line of the power supply system or one of power lines (hereafter, referred to as "N-phase") of a 200V single-phase three-wire system and a ground line (hereafter, simply referred to as "E"), and between a power line or the other power line (hereafter, referred to as "L-phase") with respect to the N-phase power line of the 200V single-phase three-wire system and E; determination means for determining presence/absence of faulty wiring in power lines connected to the aforementioned power supply terminal block based on the electric signal provided by the electric signal detection means; and output means for driving a display or alarm means that shows a determination result provided by the determination means. This makes it possible to detect faulty wiring in its primary power line during installation of an air conditioner with the device of a simple structure, and to notify the presence/absence of faulty wiring with a display, alarm or other means.

Since the electric signal detection means comprises photo-couplers connected between the L-phase and E and between the N-phase and E respectively, the alternating-current power supply side is insulated from the direct-current circuit side. This makes it possible to detect faulty wiring in its primary power line during installation of an air conditioner with the device of a simple structure, and to notify the presence/absence of faulty wiring with a display, alarm or other means.

Furthermore the electric signal detection means comprises resistors connected between the L-phase and E and between the N-phase and E, respectively. This makes it possible to detect faulty wiring in its primary power line during installation of an air conditioner with the device of a simple structure, and to notify the presence/absence of faulty wiring with a display, alarm or other means.

Since the electric signal detection means comprises capacitors connected between the L-phase and E and between the N-phase and E respectively, this makes it possible to provide an electric insulation, lower the resistance and leak current, and eventually easily meet safety standards.

Since there is provided shut-off means for shutting off the electric signal detection means from the N-phase and L-phase based on a signal provided by the output means when the determination means has detected faulty wiring, it becomes possible to use the devise without affecting the operation of the air conditioner.

Since there is provided shut-off means for shutting off the power lines from the air conditioner based on a signal provided by the output means when the determination means has detected faulty wiring, it becomes possible to prevent problems such as overheating in the wiring caused by faulty wiring.

Since there is provided shut-off means for shutting off the power lines from an external device of the air conditioner based on a signal provided by the output means when the determination means has detected faulty wiring, it becomes possible to change the output means in accordance with the type of employed determination means and thereby provide a device of higher flexibility.

What is claimed is:

1. An air conditioner comprising:
   an air conditioning unit;
   three wiring lines configured to supply power to the air conditioning unit including a pair of single phase AC power lines and an earth line configured to be connected, respectively, to three source lines including a pair of single phase AC source lines and a ground line; and
   a detection unit including,
      a detecting device configured to detect voltages between each of the AC power lines and the earth line;
      a conversion device configured to convert the voltages detected by the detecting device into logic level signals;
      a comparator configured to determine presence or absence of faulty connection between the three wiring lines and the three source lines by comparing the logic level signals obtained from the conversion device with reference logic level signals; and
      an output device configured to show a result of determination made by the comparator.

2. The air conditioner according to claim 1, wherein the detecting device comprises photo-couplers connected between the pair of single phase AC power lines and the earth line, respectively.

3. The air conditioner according to claim 1, wherein the detecting device comprises resistors connected between the pair of single phase AC power lines and the earth line, respectively.

4. The air conditioner according to claim 1, wherein the detecting device comprises capacitors connected between the pair of single phase AC power lines and the earth line, respectively.

5. The air conditioner according to claim 1, further comprising a shut-off device configured to shut off the detecting device from the pair of single phase AC power lines based on a signal provided by said output device when the comparator has detected faulty wiring.

6. The air conditioner according to claim 1, further comprising a shut-off device configured to shut off the power lines from the air conditioner based on a signal provided by the output device when the comparator has detected faulty wiring.

7. The air conditioner according to claim 1, further comprising a shut-off device configured to shut off the power lines from an external device of the air conditioner based on a signal provided by the output device when the comparator has detected faulty wiring.

* * * * *